United States Patent [19]

Teagno

[11] 4,208,080
[45] Jun. 17, 1980

[54] JUNCTION BOXES

[75] Inventor: Vladimiro Teagno, Turin, Italy

[73] Assignee: AMP Incorporated, Harrisburg, Pa.

[21] Appl. No.: 921,426

[22] Filed: Jul. 3, 1978

Related U.S. Application Data

[63] Continuation of Ser. No. 819,741, Jul. 28, 1977, abandoned.

[30] Foreign Application Priority Data

Aug. 18, 1976 [GB] United Kingdom ............... 34372/76

[51] Int. Cl.² ........................................... H01R 29/00
[52] U.S. Cl. ................................. 339/18 B; 29/830; 339/17 E; 339/95 A
[58] Field of Search ................ 339/17 R, 17 E, 17 C, 339/17 B, 18 R, 18 B, 95 R, 95 A; 361/414; 174/68.5; 29/628, 629, 626

[56] References Cited

U.S. PATENT DOCUMENTS

| | | | |
|---|---|---|---|
| 3,022,480 | 2/1962 | Tiffany | 339/95 A |
| 3,277,347 | 10/1966 | Ecker | 339/17 E |
| 3,509,268 | 4/1970 | Schwartz et al. | 174/68.5 |
| 3,660,726 | 5/1972 | Ammon et al. | 339/17 C |
| 3,932,932 | 1/1976 | Goodman | 29/625 |

FOREIGN PATENT DOCUMENTS

| | | | |
|---|---|---|---|
| 1936853 | 8/1973 | Fed. Rep. of Germany | 339/17 C |
| 1433088 | 2/1966 | France | 174/68 |

OTHER PUBLICATIONS

IBM Tech. Disc. Bulletin, Kollmeier, vol. 1, No. 6, 4-1959, p. 18.

*Primary Examiner*—Neil Abrams
*Attorney, Agent, or Firm*—Allan B. Osborne

[57] ABSTRACT

A junction box comprising a rigid insulating housing with spaced opposed faces having pairs of aligned terminal-receiving apertures, a stack of terminal boards sandwiched between the faces of the housing, each terminal board comprising a metal sheet laminated with an insulating sheet, the metal sheet being divided into areas defining discrete current paths and being perforated at locations in alignment with the terminal-receiving apertures where contact with the metal sheet is not required.

Terminals having contact portions and post portions are staked through the aligned housing apertures and stacked terminal boards, the post piercing the metal sheets at unperforated locations at various levels in the stack to effect contact therewith.

4 Claims, 1 Drawing Figure

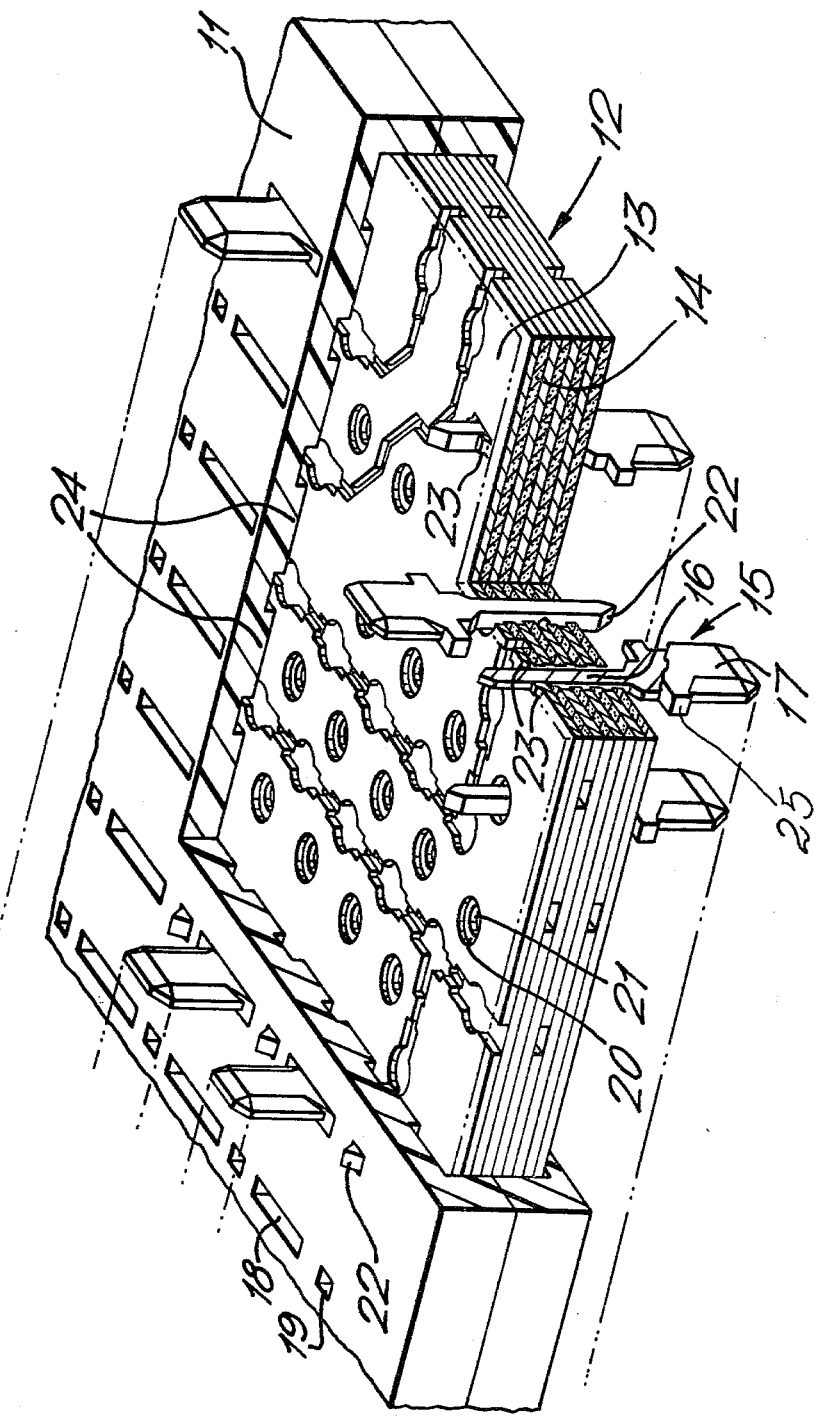

JUNCTION BOXES

This is a continuation of application Ser. No. 819,741, filed July 28, 1977, now abandoned.

The invention relates to junction boxes for interconnecting a large number of conductors for use, for example, as the main junction box for a harness system of an automobile.

It is important that such junction boxes be both robust and compact and yet that manufacturing and assembly costs are acceptable.

According to one aspect of the invention, a junction box sub-assembly comprises a rigid insulating housing with spaced opposed faces having pairs of aligned terminal-receiving apertures, a stack of terminal boards sandwiched between the faces of the housing, each terminal board comprising a metal sheet laminated with an insulating sheet, the metal sheet being divided into areas defining discrete current paths and being perforated at locations in alignment with the terminal-receiving apertures where contact with the metal sheet is not required.

Terminals having contact portions and post portions are staked through the aligned housing apertures and stacked terminal boards, the post portions piercing the metal sheets at unperforated locations at various levels in the stack to effect contact therewith. The post portions have opposite sides chamfered at their free ends to define points each of which push out a pair of spring metal arms from the metal sheet during staking. The arms grip the post portion in a reliable electrical contact.

The invention includes a method of making a junction box by staking post-form terminals through predetermined housing apertures of a junction box subassembly.

An example of junction box according to the invention will now be described with reference to the accompanying drawing which is a fragmentary perspective view of the junction box.

The junction box comprises a bipartita rigid plastics housing 11 containing a stack of terminal baords 12 in a snug fit. Each terminal board comprises a sheet of roll hardened copper 13 laminated with an insulating paper sheet 14 and divided in separate strips each defining a discrete circuit path. Terminals 15 having post portions 16 and tabs 17 are staked through aligned apertures 18 and 19 in the housing passing through perforations 20 and 21 preformed in the copper and paper sheets respectively where electrical contact is not required and piercing the copper sheets at various levels in the stack to establish electrical contact where desired. The perforations 21 are smaller than the perforations 20.

The posts are of square cross-section and one pair of opposite side 22 is chamfered to provide a sharp tip which pushes out two spring arms 23 from the copper sheet during piercing, the resilience of the arms ensuring a permanent and reliable electrical connection with opposite sides of the post. The opposed housing apertures 18 and 19 are formed as slots and square sections respectively to receive the tab and post portions of the terminals. The terminals have lugs 25 to locate the terminals in the slots 18 and prevent over-insertion.

The housing is moulded with circular feet 24 strengthening the area around each aperture and the housing contents encapsulated in epoxy resin (not shown) and stand-offs (not shown) may be provided on the feet to permit resin flow around the terminal post.

In manufacture, the copper and paper sheets are perforated where necessary and laminated together in pairs. At this stage, the copper strips are interconnected by bridges which are stamped out after lamination to define the discrete circuits. The laminates are then stacked and enclosed between the housing halves. The terminals are then staked through the boards from both sides of the housing as required. The epoxy resin may then be injected into the housing for complete sealing and additional mechanical support.

The resultant junction box is very robust and completely sealed. It is therefore, suitable for use in an adverse environment subject to vibration in an automobile. The copper sheet is of sufficient thickness to carry appliance currents and to grip the posts. Different numbers of terminal boards of different circuit configuration can be stacked within housings of identical dimensions to provide junction boxes of identical external dimensions with different functions with a consequential reduction in the number of different parts to be manufactured and stocked and obviating alteration to the automobile mounting. The same boxes can also be staked with different terminal arrangements to provide different functions. Consequential savings arise in manufacturing and applied costs.

The invention should be contrasted with prior proposals in which terminal posts of circular cross-section were driven through stacked circuit boards preformed with undersize apertures where connection with the post was desired and subsequently assembled in a rigid housing. Such method of construction is not satisfactory where the terminal boards are stacked in a housing prior to connection to the posts, as variation in moulding tolerances preclude precise alignment of the preformed board apertures and the housing apertures. In this event, with a copper layer of sufficient thickness, posts will be deflected out of alignment with housing apertures 19 during staking. Furthermore, circular posts do not push out discrete spring arms and additional steps (such as soldering) must be taken to ensure contact between the posts and the circuits.

We claim:

1. A junction box assembly comprising:
   a. a housing having opposing spaced apart surfaces of generally rigid, insulating material with the surfaces containing terminal-receiving apertures, some of said apertures being elongated and others being square with the location of the apertures being such that an aperture of one shape on one surface is in alignment with an aperture of the other shape on the other surface;
   b. a plurality of terminal boards sandwiched between the opposing housing surfaces, each of the boards comprising a metal sheet laminated with an insulating sheet, further, said boards having perforations therethrough where electrical contact therewith is not required; and
   c. a plurality of terminals of the type having at one end a post of square cross-section and at another end a tab, the tab being elongated in cross-section, said posts being receivable in the square apertures and tabs being receivable in the elongated apertures.

2. The junction box of claim 1 wherein the free end of each post is wedge-shaped so that as a terminal is staked into the assembly, the wedge-shaped end pierces the metal sheet at an unperforated location thereby forming a pair of spring metal arms which grip the sides of the post to provide mechanical retension and electrical contact.

3. A method of making a junction box assembly comprising the steps of:
   a. providing a housing of rigid, insulating material, said housing having opposing surfaces;
   b. providing a plurality of elongated and square apertures in the opposing surfaces with the apertures of one shape on one surface being aligned with apertures of the other shape on the opposite surface;
   c. providing a plurality of terminal boards comprising a metal sheet laminated on an insulating sheet;
   d. perforating said boards at spaced locations where electrical contact is not required;
   e. placing the boards in the housing between the opposing surfaces with the perforations being generally in alignment with the apertures;
   f. securing the housing and contained boards by staking terminals therethrough from both sides, said terminals being of the type having a post at one end and a tab at the other end, said tabs being received in the elongated apertures and posts being received in the square apertures.

4. The method of claim 3 wherein the free ends of the posts are wedge-shaped so that as the posts are driven through the metal sheets on the boards at non-perforated locations, pairs of spring arms are formed in the sheets, said arms being adapted to grip the sides of the posts.

* * * * *